(12) United States Patent
Shitara

(10) Patent No.: US 6,661,078 B2
(45) Date of Patent: Dec. 9, 2003

(54) INDUCTANCE ELEMENT AND SEMICONDUCTOR DEVICE

(75) Inventor: Shoichi Shitara, Chiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/090,766

(22) Filed: Mar. 6, 2002

(65) Prior Publication Data

US 2002/0145175 A1 Oct. 10, 2002

(30) Foreign Application Priority Data

Apr. 5, 2001 (JP) ........................... 2001-107730

(51) Int. Cl.[7] .............................................. H01L 29/00
(52) U.S. Cl. ...................... 257/528; 257/531; 257/533
(58) Field of Search ................... 257/528, 531, 257/533, 277

(56) References Cited

U.S. PATENT DOCUMENTS 6,452,249 B1 * 9/2002 Maeda et al. .............. 257/531

FOREIGN PATENT DOCUMENTS

JP        6-181289        6/1994

* cited by examiner

Primary Examiner—Thien Tran
(74) Attorney, Agent, or Firm—Nixon & Vanderhye P.C.

(57) ABSTRACT

The inductance element according to the present invention includes: an inductance section, provided above a semiconductor substrate via insulating films, which is composed of a conductive film pattern setted to have a predetermined inductance value; and an impurity region, provided on the semiconductor substrate so as to be positioned at least at an area under the conductive film pattern, which has a grounding potential and a denser impurity than that of the semiconductor substrate. The inductance element is provided in a semiconductor device.

16 Claims, 12 Drawing Sheets

INDUCTANCE ELEMENT AND SEMICONDUCTOR DEVICE

FIELD OF THE INVENTION

The present invention relates to an inductance element and a semiconductor device which includes the inductance element therein, and particularly to a structure of an inductance element which reduces signal loss brought about therein.

BACKGROUND OF THE INVENTION

Recently, with rapid miniaturization of portable communication devices such as a cellular phone, it has been being required to realize high frequency integrated circuits, such as an IC (Integrated Circuit) and an LSI (large-scale integration), which are used in these devices, by using a circuit provided on a silicon semiconductor substrate.

In addition to passive elements such as a transistor, a resistor, and a capacitor, an inductance element is required in the high frequency integrated circuit. Thus, in order to realize miniaturization of a device using the high frequency integrated circuit, all the foregoing passive elements including the inductance element need to be provided on the silicon semiconductor substrate. The inductance element for a silicon IC is typically provided on the silicon semiconductor substrate via an insulating film, and is made, for example, by providing a belt-shaped conductive film of aluminum (Al) in a spiral manner (in a vortex manner) or in a meandering manner.

A structure of a conventional inductance element is described as follows by reference to FIG. 8 and FIG. 9. FIG. 8 is a plan view which schematically shows a structure of an inductance element formation section in the conventional semiconductor device. Further, FIG. 9 is a cross sectional view in a line D–D' of the inductance formation section of the semiconductor device shown in FIG. 8. Note that, in FIG. 8, insulating films 5, 6, and 7 are not displayed, but patterns are given to respective components. That is, the same component has the same pattern in FIG. 8.

As shown in FIG. 9, the conventional inductance element has the following structure. The insulating films 5 and 6 are provided on a main surface of a semiconductor substrate 4, such as a silicon semiconductor substrate, in this order. A connection wire 3, connected to one terminal of an inductance section which is composed of a conductive film pattern 1 described later, is provided on the insulating film 6. The inductance section, which is composed of the conductive film pattern 1 provided in a spiral manner (in a vortex manner) as shown in FIG. 8, is provided on the insulating film 7 which covers the connection wire 3.

In the inductance section which is composed of the conductive film pattern 1 in a spiral manner, the one terminal (drawing terminal) is formed at a substantially central portion of the spiral. Further, the inductance section is connected to the connection wire 3 via a via-hole (not shown) at a position of the terminal, that is, at a substantially central portion of the spiral.

The connection wire 3 is externally drawn from the inductance section as a drawing wire for connecting to an external portion of the inductance element. The inductance element is, for example, provided in a semiconductor device, that is, provided on a semiconductor substrate of the semiconductor device internally or externally. For example, the foregoing semiconductor substrate 4 is used as the semiconductor substrate of the semiconductor device, so that the inductance element is electrically connected to an electrode pad (not shown) etc, provided on the main surface of the semiconductor substrate 4, which is electrically connected to a transistor (not shown) etc. making up an integrated circuit such as an LSI.

However, in the conventional inductance element having the foregoing structure, when a current is applied to the inductance section, an excess current occurs on a surface of the semiconductor substrate 4 due to electromagnetic induction of a current applied to the conductive film pattern 1 making up the inductance section. Therefore, a resistance component of the semiconductor substrate 4 causes a high frequency signal passing through the inductance section to be reflected and to be lost. It is known that this results in deterioration of the performance of the conventional inductance element entirely.

Generally, it is often that the inductance element is used at a high frequency band. However, the signal loss of the semiconductor substrate 4 occurs frequently particularly at a high frequency band. The performance of the inductance element is deteriorated by a parasitic component which occurs due to a shape etc. of the conductive film pattern 1 making up the inductance section.

Thus, in the semiconductor substrate 4 of the conventional inductance element, a signal loss at an area under the spiral conductive film pattern 1 is extremely large, so that the inductance element cannot be preferably used at a high frequency band.

Then, as an improving measure, Japanese Unexamined Patent Publication No. 181289/1994 (Tokukaihei 6-181289) (publication date: Jun. 28, 1994) discloses an inductance element having the following structure. A grounded metallic thin film is provided near the conductive film pattern 1 formed above the semiconductor substrate 4, so that characteristic impedance is adjusted. Thus, reflection and loss of a high frequency signal are reduced.

Concretely, in the inductance element recited in Japanese Unexamined Patent Publication No. 181289/1994, the influence upon the semiconductor substrate 4, which is exerted by electromagnetic induction of a current applied to the inductance section, is reduced by forming an inductance section on a grounded metallic thin film, so that a signal loss of the semiconductor substrate 4, that is, a characteristic loss is reduced.

By reference to FIG. 10 and FIG. 11, the inductance element of the semiconductor device, recited in Japanese Unexamined Patent Publication No. 181289/1994, is described as follows. FIG. 10 is a plan view showing a schematic structure of an inductance element formation section of the semiconductor device recited in Japanese Unexamined Patent Publication No. 181289/1994. Further, FIG. 11 is a cross sectional view in a line E–E' of the semiconductor device shown in FIG. 10. Note that, in FIG. 10, for the sake of convenience in description, the insulating films 5, 6, and 7 shown in FIG. 11 are not displayed, and patterns are given to the respective components. That is, in FIG. 10, the same pattern is given to the same component. Further, in the following description, the same signs are given to components having the same functions as components shown in FIG. 8 and FIG. 9, and description thereof is omitted.

In the foregoing semiconductor device, the insulating film 5 is provided as a first insulating film on a main surface of the semiconductor substrate 4, and a metallic thin film 2, which is a grounding metallic film (grounding potential layer), is provided on the insulating film 5 so that substantially all the surface of the semiconductor substrate 4 except for marginal portions is covered. Further, in the semiconductor device, after the metallic thin film 2 is coated by the insulating film 6 which serves as a second insulating film, the connection wire 3 which serves as a drawing wire for external connection at the inductance section is provided on the insulating film 6. Further, in the semiconductor device, the insulating film 7 which serves as a third insulating film is provided so as to cover the connection wire 3, and the conductive film pattern 1 making up the inductance section is provided in a spiral manner (in a vortex manner) on the insulating film 7.

However, in the inductance element recited in Japanese Unexamined Patent Publication No. 181289/1994, the grounded metallic thin film 2 is provided on the insulating film 5 formed on the main surface of the semiconductor substrate 4, so that parasitic capacitance is formed at a portion where the conductive film pattern 1 or the connection wire 3 is lapped by the metallic thin film 2 in a laminating direction above the semiconductor substrate 4. That is, between the conductive film pattern 1 and the grounded metallic thin film 2, and between the connection wire 3 used as a drawing wire of the conductive film pattern 1 and the metallic thin film 2, the parasitic capacitance is formed. Thus, in the inductance element, compared with an inductance element shown in FIG. 8 and FIG. 9, a thickness between the conductive film pattern 1 or the connection wire 3 and a grounding surface (grounding potential layer) decreases by a thickness of the insulating film 5, which is equivalent to a distance between a surface of the semiconductor substrate 4 and an underside of the metallic thin film 2. Therefore, in the inductance element of the semiconductor device recited in Japanese Unexamined Patent Publication No. 181289/1994, the parasitic capacitance (parasitic component) increases by the thickness of the insulating film 5, and attenuation of a signal level occurs, in a case where the inductance element is used as an inductance element for high frequency.

Thus, in the inductance element recited in Japanese Unexamined Patent Publication No. 181289/1994, the parasitic capacitance, which occurs between the conductive film pattern 1 making up the inductance section and the metallic thin film 2, causes a characteristic of the inductance element, furthermore, a characteristic of the semiconductor device having the inductance element therein to deteriorate.

Thus, it is required to develop an inductance element in which the loss is reduced, that is, to develop a high performance inductance element which can restrict the signal loss brought about by a resistance component of the semiconductor substrate 4, and to develop a semiconductor device using the inductance element.

SUMMARY OF THE INVENTION

Considering the foregoing problems, the present invention is created. The object of the present invention is to provide an inductance element and a semiconductor device in which signal loss which occurs in a semiconductor substrate is restrained, and a parasitic capacitance is reduced compared with a conventional inductance element.

In order to achieve the foregoing object, the inductance element according to the present invention, includes an inductance section, provided above a semiconductor substrate via insulating films, which is composed of a first conductive film pattern setted to have a predetermined inductance value, wherein an impurity region, which has a grounding potential and a denser impurity than that of the semiconductor substrate, is provided on the semiconductor substrate so as to be positioned at least at an area under the first conductive film pattern.

According to the structure, the impurity region is provided on the semiconductor substrate so as to be positioned at least at the area under the first conductive film pattern, and the impurity region has the grounding potential and the denser impurity than that of the semiconductor substrate. Therefore, it is possible to provide the following high performance inductance element. In the inductance element, it is possible to reduce reflection and loss of a high frequency signal passing through the inductance section which result from electromagnetic induction of a current applied to the inductance section, so that it is possible to restrict decline of the Q value which indicates the performance of the inductance element with respect to frequency.

Further, according to the structure, it is possible to enlarge a film thickness (distance) between the inductance section and a grounding surface, that is, a layer or an area which is used as the grounding potential layer, so that it is possible to reduce the parasitic capacitance, compared with the inductance element of Japanese Unexamined Patent Publication No. 181289/1994 (Tokukaihei 6-181289) . Thus, it is possible to reduce attenuation of a signal level which is brought about by the parasitic capacitance.

In order to achieve the foregoing object, the semiconductor device according to the present invention includes the inductance element according to the present invention. It is preferable that the inductance element is provided in the semiconductor device.

According to the structure, the inductance element is, for example, provided in the semiconductor device, so that it is possible to reduce reflection and loss of a high frequency signal passing through the inductance section which result from electromagnetic induction of a current applied to the inductance section, so that it is possible to restrict decline of the Q value which indicates the performance of the inductance element with respect to frequency. Besides, the parasitic capacitance can be reduced, so that it is possible to provide a semiconductor device having a high quality inductance characteristic.

Further, according to the structure, in the semiconductor device, the inductance element is separated from a semiconductor substrate on which an integrated circuit making up the semiconductor device is provided, for example, the inductance element is separated from an integrated circuit formation section (element formation section) of the semiconductor substrate, so that it is possible to prevent other elements from being influenced by noise.

For a fuller understanding of the nature and advantages of the invention, reference should be made to the ensuing detailed description taken in conjunction with the accompanying drawings.

DESCRIPTION OF THE EMBODIMENT

EMBODIMENT 1

One embodiment of the present invention is described as follows based on FIG. 1 to FIG. 5 and FIG. 12.

Figure 1:
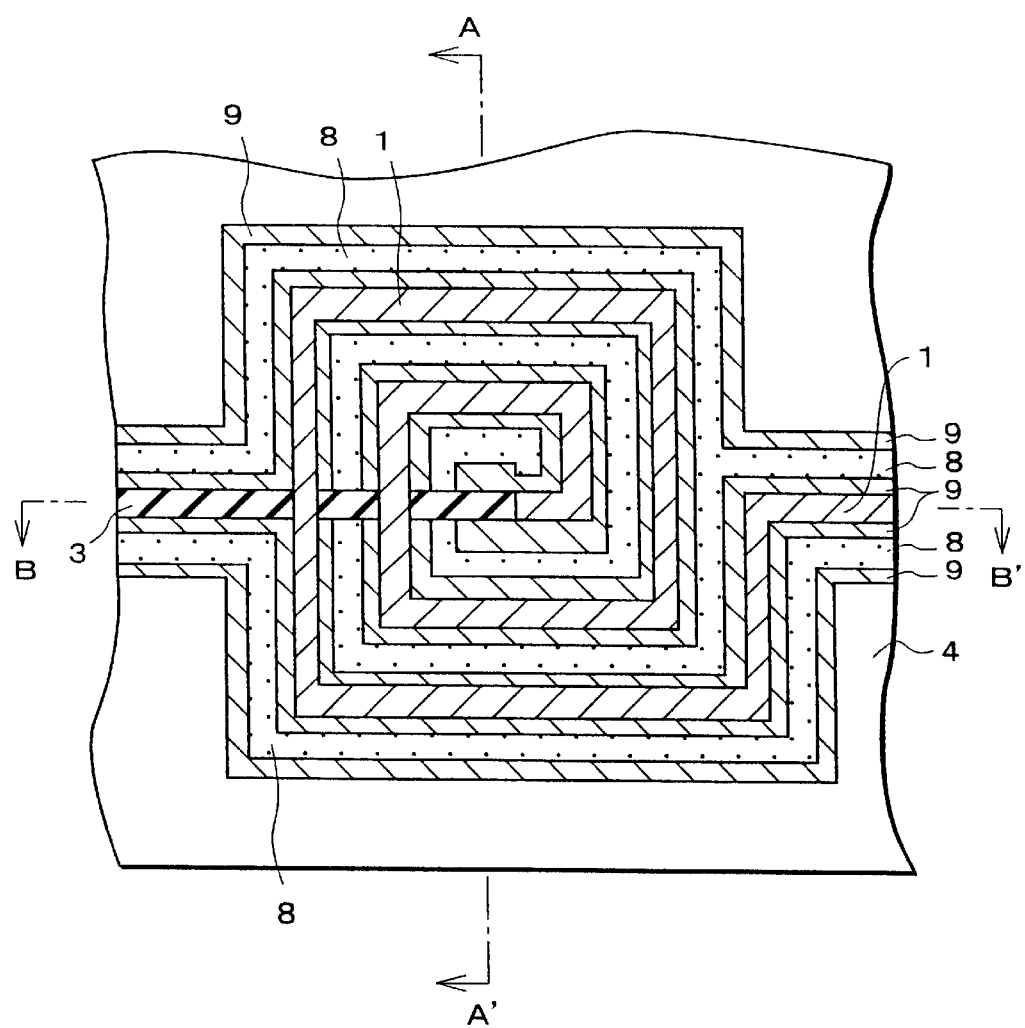
FIG. 1 is a plan view showing a schematic structure of an inductance element formation section of a semiconductor device according to an embodiment of the present invention.
Figure 2:
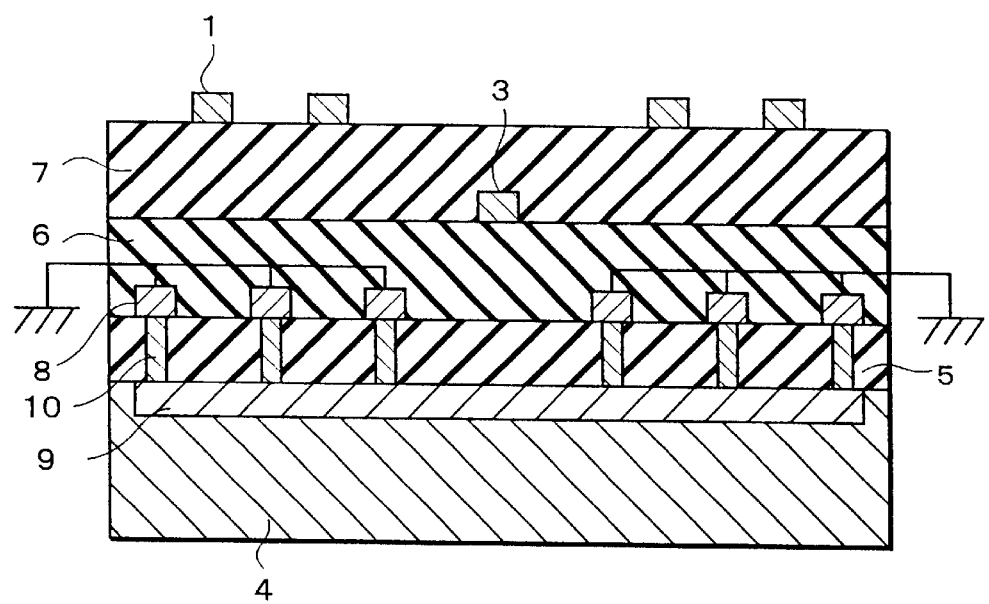
FIG. 2 is a cross sectional view in a line A–A' of the semiconductor device.
Figure 4:
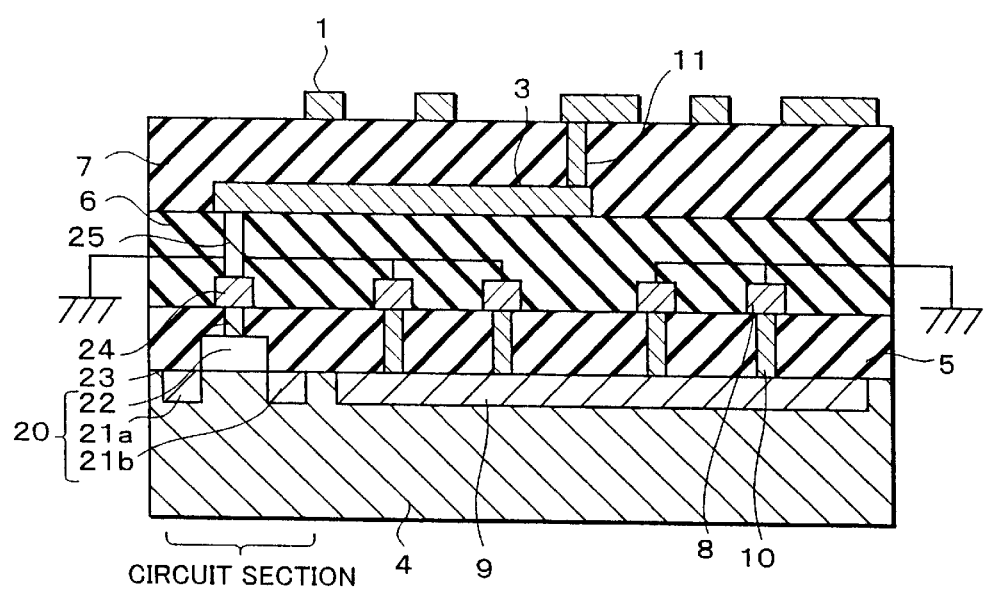
FIG. 4 is a cross sectional view in a line B–B' of FIG. 1, and shows a structure of a semiconductor device in which the inductance element is connected to a gate electrode of a transistor provided in the semiconductor device.
Figure 5:
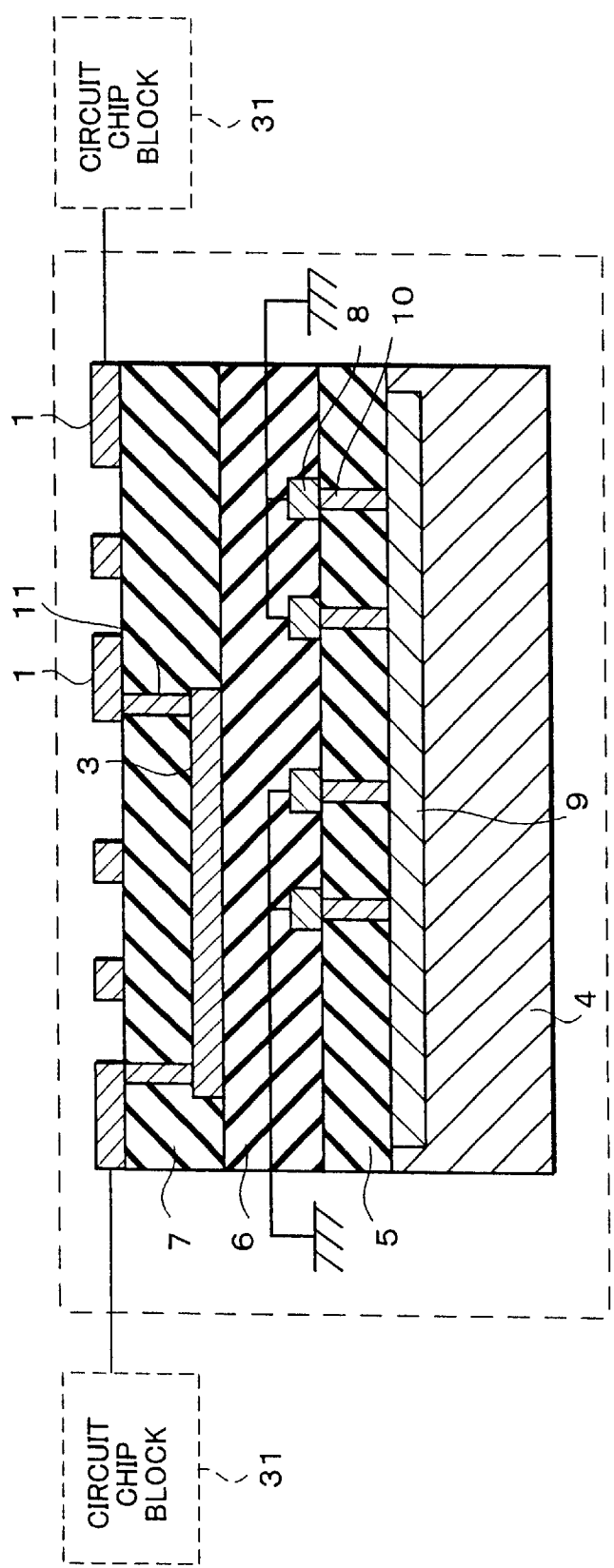
FIG. 5 is a cross sectional view in a line B–B' of FIG. 1, and shows a structure of a semiconductor device in which the inductance element is connected to an external circuit.

FIG. 1 is a plan view showing a schematic structure of an inductance element of a semiconductor device according to the present embodiment. FIG. 2 is a cross sectional view in a line A–A' of the semiconductor device shown in FIG. 1. Further, each of FIG. 4 and FIG. 5 shows an example where the inductance element according to the present embodiment is connected to a circuit section of the semiconductor device, by a cross sectional view in a line B–B' of the semiconductor device shown in FIG. 1. Note that, in FIG. 1, for the sake of convenience in description, insulating films 5, 6, and 7, shown in FIG. 2, are not displayed, and a pattern is given to each component. That is, in FIG. 1, the same pattern is given to the same component. Further, in the following description, the same signs are given to components having the same functions as components shown in BACKGROUND OF THE INVENTION, and description thereof is omitted.

An inductance element according to the present embodiment is, for example, provided in a semiconductor device, that is, provided on a semiconductor substrate of the semiconductor device internally or externally. In the inductance element, as shown in FIG. 2, an inductance section, which is composed of a conductive film pattern 1 (first conductive film pattern), is provided above a semiconductor substrate 4 via insulating films (insulating films 5, 6, and 7 in the present embodiment)

The inductance element includes: a semiconductor substrate 4; an impurity region 9; an insulating film 5 (first insulating film); an insulating film 6 (second insulating film); an insulating film 7 (third insulating film); a conductive film 8 (second conductive film pattern); a connection wire 3 (third conductive film pattern); the conductive film pattern 1; a contact hole 10 (via-hole); and a via-hole 11 (see FIG. 4 and FIG. 5).

The impurity region 9 is provided on a surface of the semiconductor substrate 4. Further, the insulating film 5 (first insulating film), the insulating film 6 (second insulating film), the insulating film 7 (third insulating film), the conductive film 8 (second conductive film pattern), and the connection wire 3 (third conductive film pattern) are provided above the semiconductor substrate 4. Further, the contact hole 10 (via-hole) electrically connects the conductive film 8 to the impurity region 9. The via-hole 11 electrically connects the connection wire 3 to the conductive film pattern 1.

To form the inductance element, that is, to form a semiconductor device by using the semiconductor substrate 4 having the inductance section, for example, it is possible to employ a process in which an integrated circuit such as an LSI is provided on the semiconductor substrate 4. Further, to form the semiconductor device, it is possible to employ a process in which the semiconductor substrate 4 having the inductance section is provided on a semiconductor substrate having the integrated circuit. Alternatively, to form the semiconductor device, it is possible to employ a process in which plural semiconductor substrates which includes the semiconductor substrate 4 having the inductance section are provided on a semiconductor substrate mounting section of a lead frame, so as to store the semiconductor substrates in a single package.

That is, as long as a predetermined inductance characteristic can be obtained, the inductance element may be wired, and may be provided in a semiconductor substrate having a transistor etc. making up the LSI.

However, the integrated circuit such as the LSI is provided on the semiconductor substrate 4 having the inductance section, and the inductance element is provided by using a wiring pattern, so that the number of parts is reduced and a manufacturing cost can be reduced.

In the present embodiment, description is given as follows by taking, as examples, mainly the case where the integrated circuit such as the LSI is provided on the semiconductor substrate 4 having the inductance section, that is, the case where the inductance element is provided on the semiconductor substrate, having the integrated circuit such as the LSI, in the semiconductor device.

On a surface (main surface) of the semiconductor substrate 4 of the inductance element, the impurity region 9 whose impurity is denser than that of the semiconductor substrate 4 is provided, for example, so as to cover substantially all the surface (main surface) of the semiconductor substrate 4 of the inductance formation section, except for marginal portions of the semiconductor substrate 4. Concretely, the impurity region 9, as shown in FIG. 1 and FIG. 2, is provided on the semiconductor substrate 4 so as to cover a whole area under an area where the conductive film pattern 1 is formed.

Further, on the surface (main surface) of the semiconductor substrate 4, for example, on marginal portions of the surface (main surface) of the semiconductor substrate 4, a transistor etc. (not shown; for example, transistor 20 shown in FIG. 4), making up the integrated circuit such as the LSI, is provided.

On the marginal portions of the main surface of the semiconductor substrate 4, for example, there may be provided an electrode pad (connection electrode, grounding terminal; not shown), which is used to ground the conductive film 8 and to electrically connect the conductive film pattern 1 to the integrated circuit formed on the semiconductor substrate 4 so that the electrode pad is exposed. By providing the electrode pad, it is possible to use the transistor making up the integrated circuit such as the LSI so that, for example, the transistor is electrically connected to the electrode pad.

In the present embodiment, a p type silicon semiconductor substrate is used as the semiconductor substrate 4, and a p type impurity region 9 having the same polarity as the semiconductor substrate 4 is provided on a surface (main surface) of the p type silicon semiconductor substrate.

In the present embodiment, the impurity region 9 is used as a grounding region (grounding potential layer). As shown in FIG. 2, on the main surface of the semiconductor substrate 4 having the impurity region 9, the insulating film 5 is provided as the first insulating film so as to cover the impurity region 9. As shown in FIG. 1 and FIG. 2, a grounded conductive film 8, which is used to ground the impurity region 9, is provided as the second conductive film pattern on the insulating film 5. The conductive film 8 is provided on the insulating film 5 so as not to be positioned under the conductive film pattern 1 making up the inductance section and under the connection wire 3 used as a drawing wire for connection of the inductance section, for example, the conductive film 8 is provided on an area except for areas under the conductive film pattern 1 and the connection wire 3.

That is, the conductive film 8 is provided so that the conductive film 8 is not lapped by the conductive film pattern 1, so that it is possible to enlarge the distance between the conductive film pattern 1 and a grounding surface (that is, grounding area (grounding potential layer)) opposite to the conductive film pattern 1. Therefore, it is possible to reduce the parasitic capacitance which occurs between the conductive film pattern 1 and the grounding area (grounding potential layer), or the impurity region 9 in the present embodiment.

Further, the conductive film 8 is provided so that the conductive film 8 is not lapped by the connection wire 3. As a result, it is possible to enlarge the distance between the connection wire 3 and the grounding surface (that is, grounding area (grounding potential layer)) opposite to the connection wire 3. Therefore, it is possible to reduce the parasitic capacitance which occurs between the connection wire 3 and the grounding area (grounding potential layer), or the impurity region 9 in the present embodiment.

In the insulating film 5, as shown in FIG. 2, a contact hole 10 is provided under an area where the conductive film 8 is formed. The impurity region 9 is electrically connected to the conductive film 8 via the contact hole 10.

Further, on the insulating film 5, the insulating film 6 is provided as the second insulating film so as to cover the conductive film 8. On the insulating film 6, a drawing wire which is drawn to one terminal of the conductive film pattern 1 is provided, that is, the connection wire 3, consisting of a conductive film (conductive film pattern), which is used as a drawing wire of the inductance section, is provided. Further, the conductive film pattern 1, made of belt-shaped conductive film, which makes up the inductance section, is provided on the insulating film 7, used as the third insulating film, which covers the connection wire 3.

The conductive film pattern 1 is, as shown in FIG. 1, provided in a spiral (vortex) wiring pattern. The one terminal (drawing terminal) of the conductive film pattern 1 is formed at a substantially central portion of the spiral conductive film pattern 1. The spiral conductive film pattern 1 is connected to one end of the connection wire 3 via a via-hole 11 (for example, see FIG. 4) at the substantially central portion of the spiral. The other end of the connection wire 3 is connected to an electrode pad (not shown) which is exposed at the marginal portions of the main surface of the semiconductor substrate 4, or is connected to the transistor (for example, a transistor 20 shown in FIG. 4) etc. of the circuit section.

That is, the connection wire 3 is used as a lead section for connecting the conductive film pattern 1 to the electrode pad provided on the marginal portions of the main surface of the semiconductor substrate 4, that is, the electrode pad connected to the integrated circuit etc. formed on the semiconductor substrate 4, or the transistor formed on the circuit section of the integrated circuit etc. Further, the conductive film pattern 1 is electrically connected from the central portion of the spiral to the outside, for example, to the integrated circuit formed on the semiconductor substrate 4, via the via-hole 11, by the connection wire 3. A current is applied to the conductive film pattern 1, so that the conductive film pattern 1 operates as an inductance element.

Next, by reference mainly to FIG. 1 and FIG. 2, a manufacturing method of the semiconductor device according to the present embodiment, particularly, a manufacturing method of the inductance element (inductance element section) of the semiconductor device, are described as follows.

In the present embodiment, first, the p type impurity region 9 is formed on the p type silicon semiconductor substrate used as the semiconductor substrate 4, in accordance with a method such as a low energy ion injection method in which, for example, boron trifluoride (BF3) typically used in a CMOS (complementary metal oxide semiconductor) process is used. On the impurity region 9, the insulating film 5 made of, for example, silicon dioxide ($SiO_2$) is formed by a known method such as plasma CVD (chemical vapor deposition).

Next, the contact holes 10 for connecting the impurity region 9 to the conductive film 8 are provided in predetermined areas of the insulating film 5 by using a photoresist, in accordance with RIE (Reactive Ion Etching) etc., and plating etc. is performed, so that the impurity region 9 is exposed partially. Thereafter, the conductive film 8 made of, for example, aluminum (Al) is formed so as to cover the contact holes 10 by using the photoresist, in accordance with methods such as deposition, sputtering, or printing. Thus, the contact hole 10 is connected to, for example, the electrode pad etc. which serves as a grounding point (grounding terminal) due to the conductive film 8, and is used as a contact hole for grounding the impurity region 9.

The contact hole 10 and the conductive film 8 connected to the contact hole 10 are provided in and on the insulating film 5, for example, they are provided in the vicinity of an area under the conductive film pattern 1 so as not to be lapped by the connection wire 3 used as a drawing wire for connection, and so as not to be lapped particularly by the conductive film pattern 1 making up the inductance section.

Concretely, the conductive film 8 and the contact hole 10 are provided so as not to be positioned under the conductive film pattern 1 and the connection wire 3 (that is, at an area under the conductive film pattern 1 and an area under the connection wire 3), and covers substantially a whole surface (main surface) of the semiconductor substrate 4 except for the marginal portions of the semiconductor substrate 4. More concretely, the conductive film 8 and the contact hole 10 are, as shown in FIG. 1 and FIG. 2, provided below a surface where the conductive film pattern 1 is formed, so as to cover a whole surface of the semiconductor substrate 4 except for an area under the conductive film pattern 1 and the connection wire 3. Thus, the conductive film 8 is provided in the vicinity of an area under the conductive film pattern 1 so as to be formed along the conductive film pattern 1.

Note that, in order to reduce the parasitic capacitance which occurs between the conductive film pattern 1 and the impurity region 9 used as a grounding potential layer, and in order to reduce the parasitic capacitance which occurs between the connection wire 3 and the impurity region 9, it is preferable that the conductive film 8 and the contact hole 10 are provided so that a substantially whole area, or preferably a whole area of the conductive film 8 and the contact hole 10 are not lapped by the conductive film pattern 1 making up the inductance section and the connection wire 3. However, as shown in the present embodiment, when the conductive film 8 for grounding the impurity region 9 is provided at any point under an area where the inductance section is formed, that is, at any point under an area where the conductive film pattern 1 is formed, there may exist a point where the conductive film 8 is partially lapped by the conductive film pattern 1 or the connection wire 3, so as to be connected to the electrode pad which serves as a grounding point (grounding terminal).

Thereafter, the insulating film 6 is provided on the insulating film 5 again by using, for example, $SiO_2$, in accordance with a known method such as plasma CVD, so as to coat the conductive film 8. The connection wire 3 made of, for example, Al is provided on the insulating film 6 by using the photoresist, in accordance with methods such as deposition, sputtering, or printing. The insulating film 7 is provided on the insulating film 6 as in the insulating films 5 and 6, so as to coat the connection wire 3. The via-hole 11 for connecting the connection wire 3 to the conductive film pattern 1 is provided in a predetermined area of the insulating film 7 in accordance with RIE or a plating method, and the connection wire 3 is partially exposed.

Next, the inductance section, which is composed of the conductive film pattern 1, is provided on the insulating film 7 so that its wiring pattern is set to have a desired inductance value, by using the photoresist, in accordance with methods such as deposition, sputtering, or printing. In the present embodiment, the conductive film pattern 1 is made of a conductive film (wire) having a spiral-belt shape (in a spiral manner). One end of the conductive film pattern 1 is provided at a substantially central portion of the conductive film pattern 1, and is electrically connected to one end of the connection wire 3 via the via-hole 11. While, the other end of the conductive film pattern 1 is, for example, connected to an electrode pad (not shown) etc. exposed at peripheral portions of the semiconductor substrate 4. Thereafter, the surface of the semiconductor substrate 4 including the conductive film pattern 1 is protected by, for example, a passivation film (not shown) such as polyimide, as required.

It is possible to manufacture the inductance element provided in the foregoing manner and the semiconductor device having the inductance element therein as an inductance element section by using a typical CMOS process with respect to three or more layers of wiring. For example, Al of about 0.5 $\mu$m to 0.7 $\mu$m is used to provide the respective conductive film patterns (that is, conductive film pattern 1, connection wire 3, and conductive film 8), and an $SiO_2$ film of about 1 $\mu$m is used to provide the insulating films 5, 6, and 7. However, it is not necessary to use these materials exclusively. It is also possible to use gold (Au) or copper (Cu) to provide the conductive film making up the conductive film pattern, and it is also possible to use polyimide or epoxy resin etc. to provide the insulating films 5, 6, and 7. Further, the respective via-holes such as the contact hole 10 and the via-hole 11 are made of, for example, the same conductive materials as those used to provide the foregoing respective conductive films.

Figure 10:
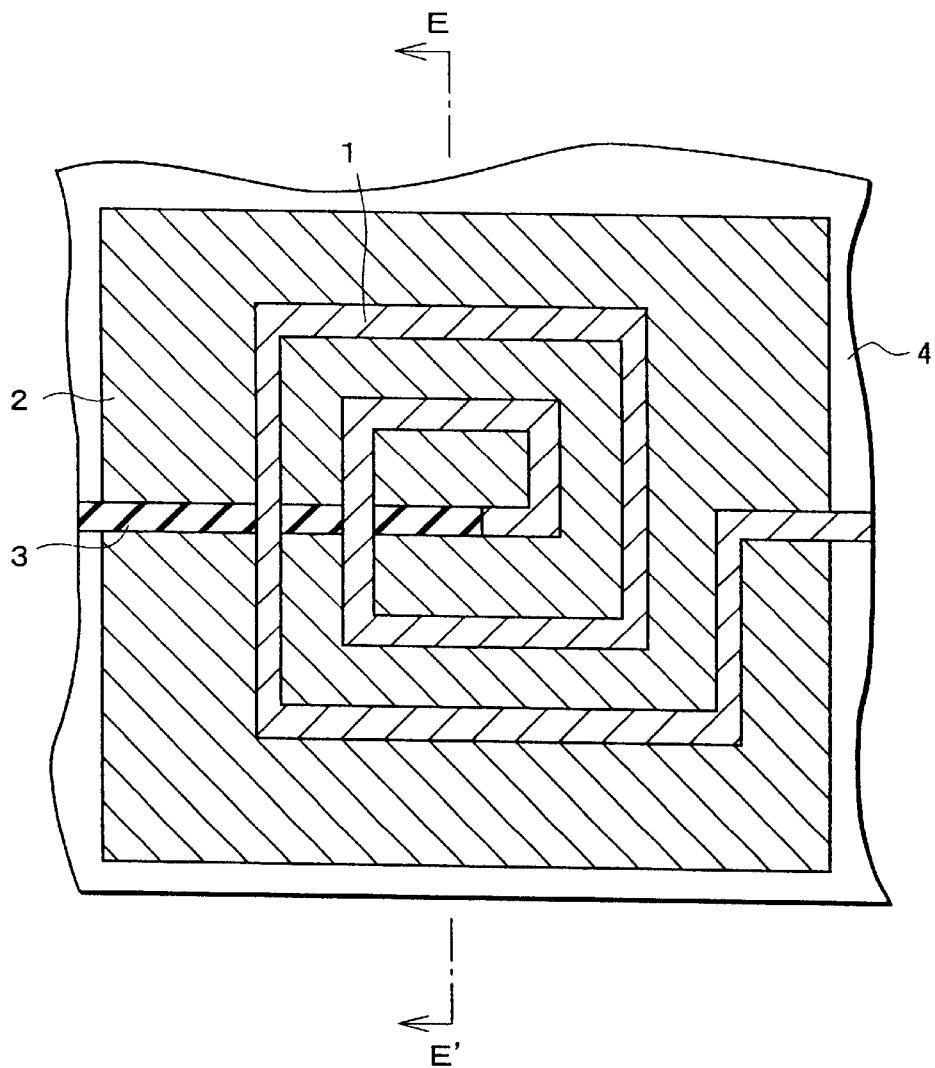
FIG. 10 is a plan view showing a schematic structure of an inductance element of another conventional semiconductor device.
Figure 11:
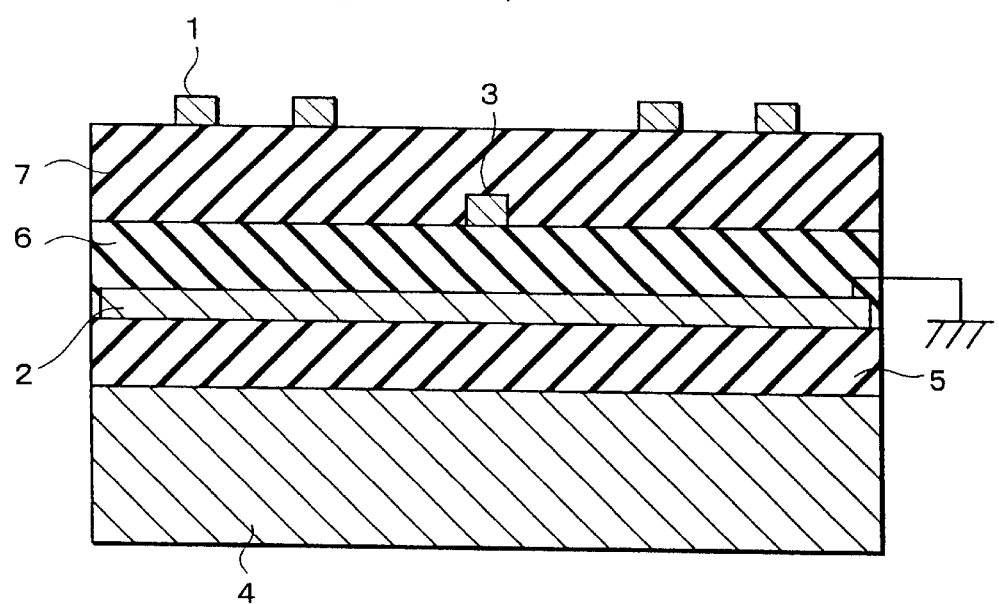
FIG. 11 is a cross sectional view in a line E–E' of the inductance element of the semiconductor device shown in FIG. 10.

As described above, according to the present embodiment, the minimum number of conductive films required in forming the inductance element of the semiconductor device is three as in a semiconductor device (see FIG. 10 and FIG. 11) recited in Japanese Unexamined Patent Publication No. 181289/1994. However, compared with a case where the metallic thin film 2 provided on the insulating film 5 which serves as the first insulating film is used as a grounding conductor (grounding potential layer) as described in Japanese Unexamined Patent Publication No. 181289/1994, it is possible to enlarge the distance between the inductance section and the grounding surface, that is, it is possible to enlarge a thickness between the inductance section and a grounding surface, that is, a layer or an area used as the grounding potential layer, in a case where the impurity region 9 is provided on the surface of the semiconductor substrate 4 and the impurity region 9 is used as the grounding area (grounding potential layer).

Figure 3:
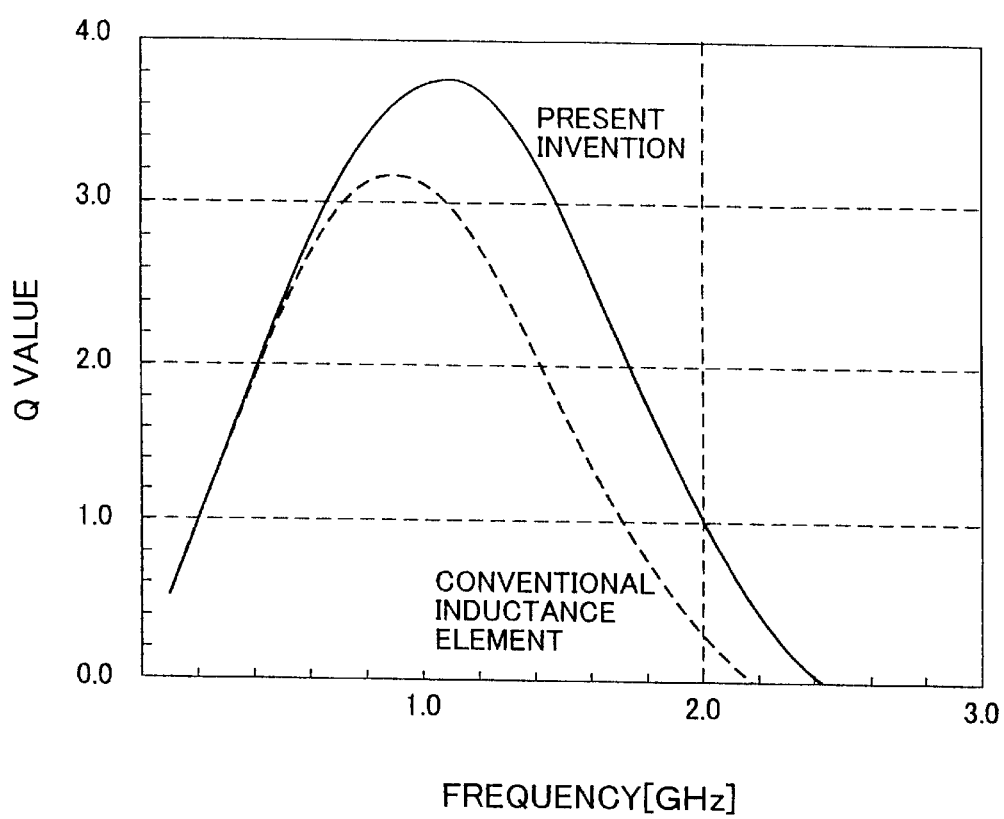
FIG. 3 is a graph showing frequency dependency of a Q value in the inductance element of the semiconductor device.

FIG. 3 shows a result of a characteristic simulation with respect to the inductance element according to the present embodiment and a conventional inductance element in which the impurity region 9 having the grounding potential is not provided on the semiconductor substrate 4. FIG. 3 is a graph showing frequency dependency of a Q value which indicates the performance of the respective inductance elements with respect to frequency. FIG. 3 shows that the frequency dependency of the Q value is obviously improved according to the present embodiment, compared with the conventional inductance element.

As described above, the inductance element according to the present embodiment is arranged so that the grounded impurity region 9 (grounding potential layer) is provided on the surface (main surface) of the semiconductor substrate 4 so as to be positioned under the conductive film pattern 1 formed above the semiconductor substrate 4 via the insulating films 5, 6, and 7. Thus, it is possible to reduce reflection and loss of a high frequency signal passing through the inductance section which result from electromagnetic induction of a current applied to the inductance section, so that it is possible to restrict decline of the Q value which indicates the performance of the inductance element with respect to frequency. Therefore, it is possible to improve the performance of the obtained inductance element, and it is possible to reduce the parasitic capacitance compared with the conventional inductance element.

It is possible to ground the impurity region 9 by means of the grounded conductive film 8 provided above the semiconductor substrate 4 via the insulating film 5 which serves as the first insulating film and the contact hole 10 for connecting the conductive film 8 to the impurity region 9.

Upon grounding, the conductive film 8 for grounding the impurity region 9 and the contact hole 10, that is, the conductive film 8 used as a wire for grounding the impurity region 9 and the contact hole 10 are provided so as not to be positioned at an area under the conductive film pattern 1, so that it is possible to obtain the following advantage. That is, it is possible to use the impurity region 9 on the surface of the semiconductor substrate 4 as the grounding potential layer for reducing reflection and loss of the high frequency signal passing through the conductive film pattern 1.

Next, as an example of the semiconductor device having the inductance element therein, FIG. 4 shows a case where the integrated circuit such as the LSI is provided on the semiconductor substrate 4 having the inductance section. That is, as an example where the inductance element is provided in the semiconductor substrate 4 having the integrated circuit such as the LSI, which serves as a semiconductor substrate of a semiconductor device, FIG. 4 shows a case where the inductance element is connected to a gate electrode 22 of a transistor 20 provided in the semiconductor device.

FIG. 4 is a cross sectional view in a line B–B' of FIG. 1, and shows a structure of a semiconductor device in which the inductance element is connected to the gate electrode 22 of the transistor 20 provided in the semiconductor device.

Generally, an inductance element is used for an analog circuit. While, a method for connecting the gate electrode 22 to the inductance element as shown in FIG. 4 is used in a case where the inductance element is used as a matching circuit in a low noise amplifier.

In a semiconductor device shown in FIG. 4, the impurity region 9 whose impurity is denser than that of the semiconductor substrate 4 making up the inductance element is provided. Further, in the semiconductor device, for example, impurity regions 21a and 21b, which are used respectively as a source or a drain region of the transistor 20 making up a circuit section of the semiconductor device, are provided. It is possible to form the impurity region 9 of the inductance element, while performing a forming process of the impurity regions 21a and 21b, that is, while performing a process of injecting impurity into the source or drain region of the transistor 20, for example, at the same time, in the foregoing semiconductor device.

In the semiconductor device, the transistor 20 is connected to the inductance element by electrically connecting a conductive film 24 to the other end of the connection wire 3 (that is, an end which is not connected to the conductive film pattern 1), via a via-hole 25 provided in the insulating film 6. The connection wire 3 serves as a drawing wire for connection of the inductance section. The conductive film 24 is electrically connected to the gate electrode 22 of the transistor 20 via the via-hole 23 provided in the insulating film 5.

The contact hole 10, which connects the impurity region 9 to the conductive film 8 in the inductance element, and the conductive film 8 can be formed, for example, while performing a formation process of the via-hole 23 and the conductive film 24 at the same time.

Next, FIG. 5 shows an example of a semiconductor device in which the inductance element is externally provided on the semiconductor substrate 4 of the semiconductor device. FIG. 5 is a cross sectional view in a line B–B' of FIG. 1, and shows a structure of the semiconductor device in which the inductance element is connected to external circuits.

In FIG. 5, in a case where the semiconductor substrate 4 is formed only by an inductance element as in an inductance element provided in the semiconductor device shown in FIG. 4, the semiconductor substrate 4 is directly connected to a circuit chip block 31 by the conductive film pattern 1. In the circuit chip block 31, another circuit is formed. As the circuit chip block 31, for example, amplifiers etc. can be used, but other materials may be used.

As described above, in the semiconductor device according to the present embodiment, the inductance element may be provided in the semiconductor device by using the semiconductor substrate 4 making up the semiconductor device and other wires etc., while forming other members, for example, the transistor 20 etc. of the circuit section such as the integrated circuit etc. at the same time, or the inductance element may be formed as a separate part from other circuit substrates.

In the present embodiment, as described above, the CMOS process is used to provide the inductance element. Therefore, upon providing the semiconductor device, it is preferable that, by providing the integrated circuit such as the LSI on the semiconductor substrate 4 having the inductance section, the inductance element is provided in the semiconductor device. The inductance element is preferably used particularly for the semiconductor device like this.

The semiconductor device according to the present embodiment includes, for example, an RF (radio frequency) transistor, a low noise amplifier etc. Further, the inductance element is, for example, used as a part of these circuits.

Note that, in the present embodiment, description was given by taking, as an example, the case where a shape of the conductive film pattern 1 making up the inductance section is spiral. However, the present embodiment is not limited to this shape, but the shape of the conductive film pattern 1 can be various shapes such as a meandering-shape, a rectangular shape, and so on.

Figure 12:
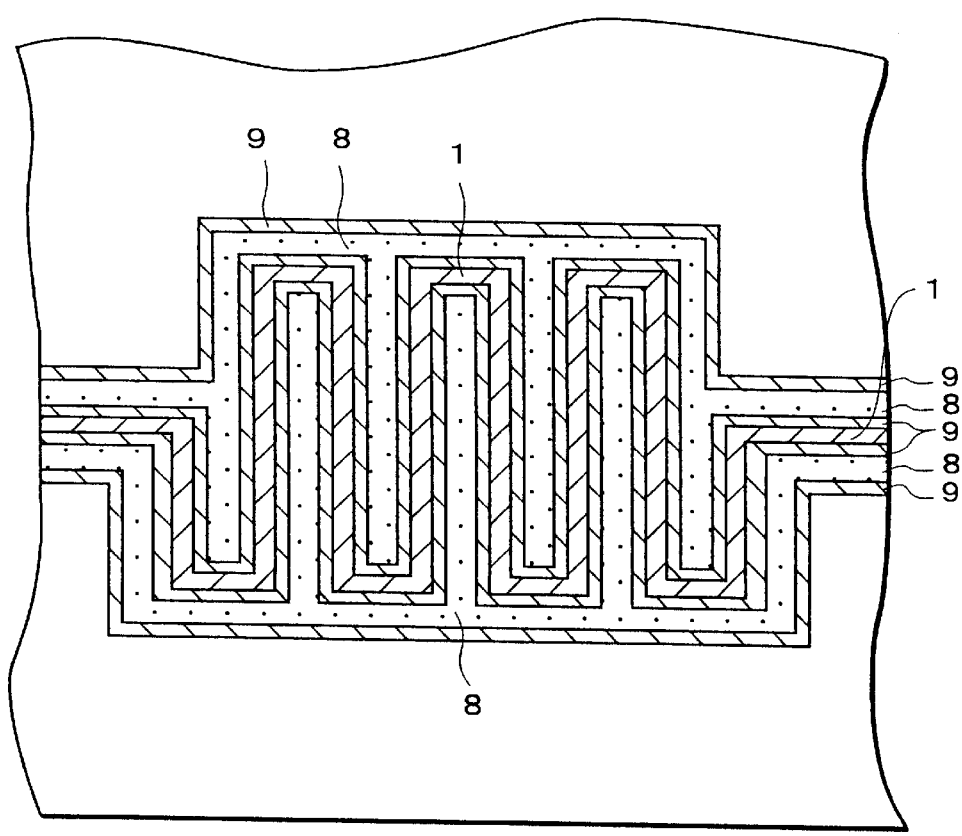
FIG. 12 is a plan view showing another structure of the inductance element formation section of the semiconductor device according to one embodiment of the present invention.

For example, in a case where the conductive film pattern 1 is formed in a meandering manner (what is called, a meander-type inductor) as shown in FIG. 12, area efficiency is lower than a case where the conductive film pattern 1 is formed in a spiral manner (what is called, a spiral inductor), but the inductor component is smaller, so that it is possible to heighten resonance frequency. Further, in the case where the conductive film pattern 1 is formed in a meandering manner, the drawing wire is not required, so that the structure can be simplified.

While, the inductance section is provided by using the spiral conductive film pattern 1 (wiring pattern) as described above, so that it is possible to obtain the strong inductance characteristic in a small area occupied by the inductance section. The conductive film pattern 1 can be provided not only by the deposition, the sputtering, and the printing, but also by using a wire etc. A shape, the number of times wound, thickness of the film, and width of a pattern (width of the conductive film) are set, as required, so as to obtain a desired inductance value.

Further, in the present embodiment, the p type silicon semiconductor substrate is used as the semiconductor substrate 4, and the p type impurity region 9 is formed on a surface (main surface) of the p type silicon semiconductor substrate. However, an n type silicon semiconductor substrate may be used as the semiconductor substrate 4, and an n type impurity region 9 may be formed on a surface (main surface) of the n type silicon semiconductor substrate. Note that, the impurity region 9 is a grounding potential layer, connected to the ground (grounded), which has low resistance. Further, the impurity region 9 may have the same polarity as the semiconductor substrate 4, and may have an inverse polarity.

EMBODIMENT 2

Another embodiment of the present invention is described based on FIG. 6 and FIG. 7 as follows. Note that, in the present embodiment, the same signs are given to components having the same functions as the components described in Embodiment 1, and descriptions thereof are omitted. In the present embodiment, differences between the present embodiment and Embodiment 1 will be described.

Figure 6:
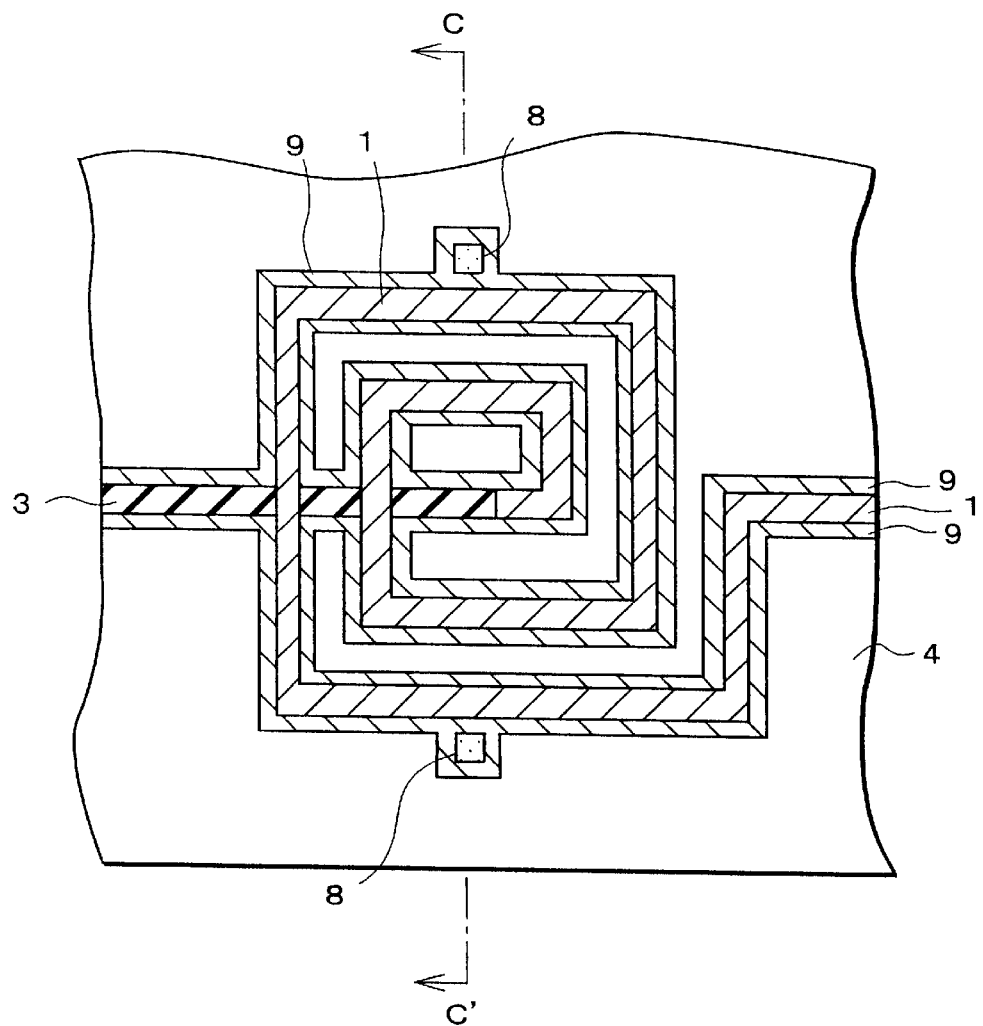
FIG. 6 is a plan view showing a schematic structure of an inductance element formation section of a semiconductor device according to another embodiment of the present invention.

FIG. 6 is a plan view showing a schematic structure of an inductance element formation section of a semiconductor device according to the present embodiment. Further, FIG. 7 is a cross sectional view in line C–C' of the semiconductor device shown in FIG. 6. Note that, in FIG. 6, for the sake of convenience in description, the insulating films 5, 6, and 7 shown in FIG. 7 are not displayed, and patterns are given to the respective components. That is, in FIG. 6, the same patterns are given to the same components.

As described above, in the semiconductor device according to Embodiment 1, as shown in FIG. 1 and FIG. 2, the impurity region 9 is provided on the semiconductor substrate 4 so as to cover whole area under an area where the inductance section is formed. Further, in the semiconductor device, the conductive film 8 which grounds the impurity region 9 is provided in the vicinity of an area under the conductive film pattern 1 (wire) making up the inductance section so as to be formed along the conductive film pattern (wire) 1.

Figure 7:
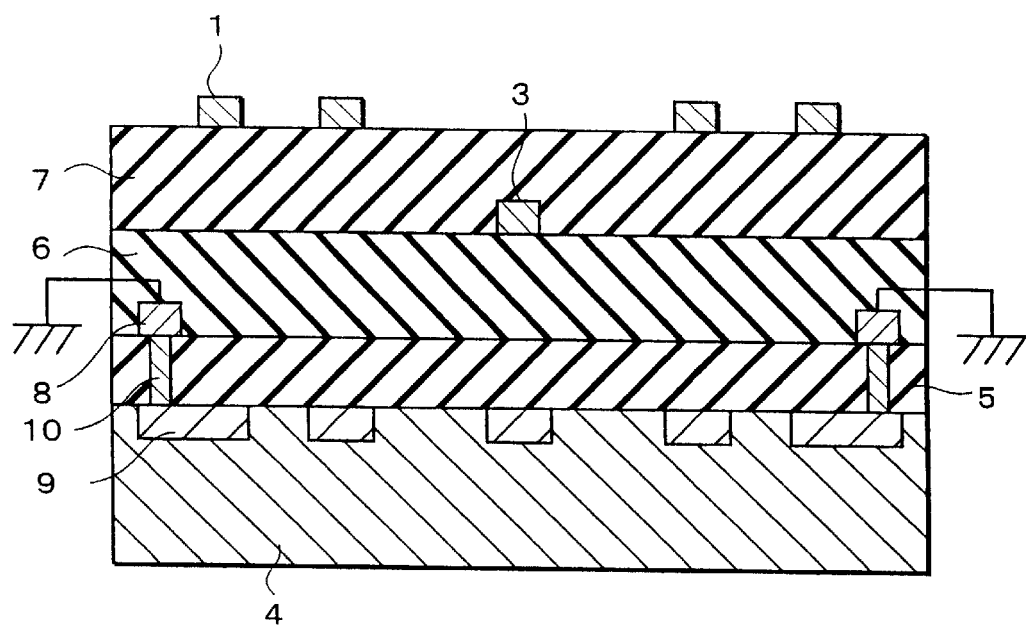
FIG. 7 is a cross sectional view in line C–C' of the semiconductor device shown in FIG. 6.
Figure 8:
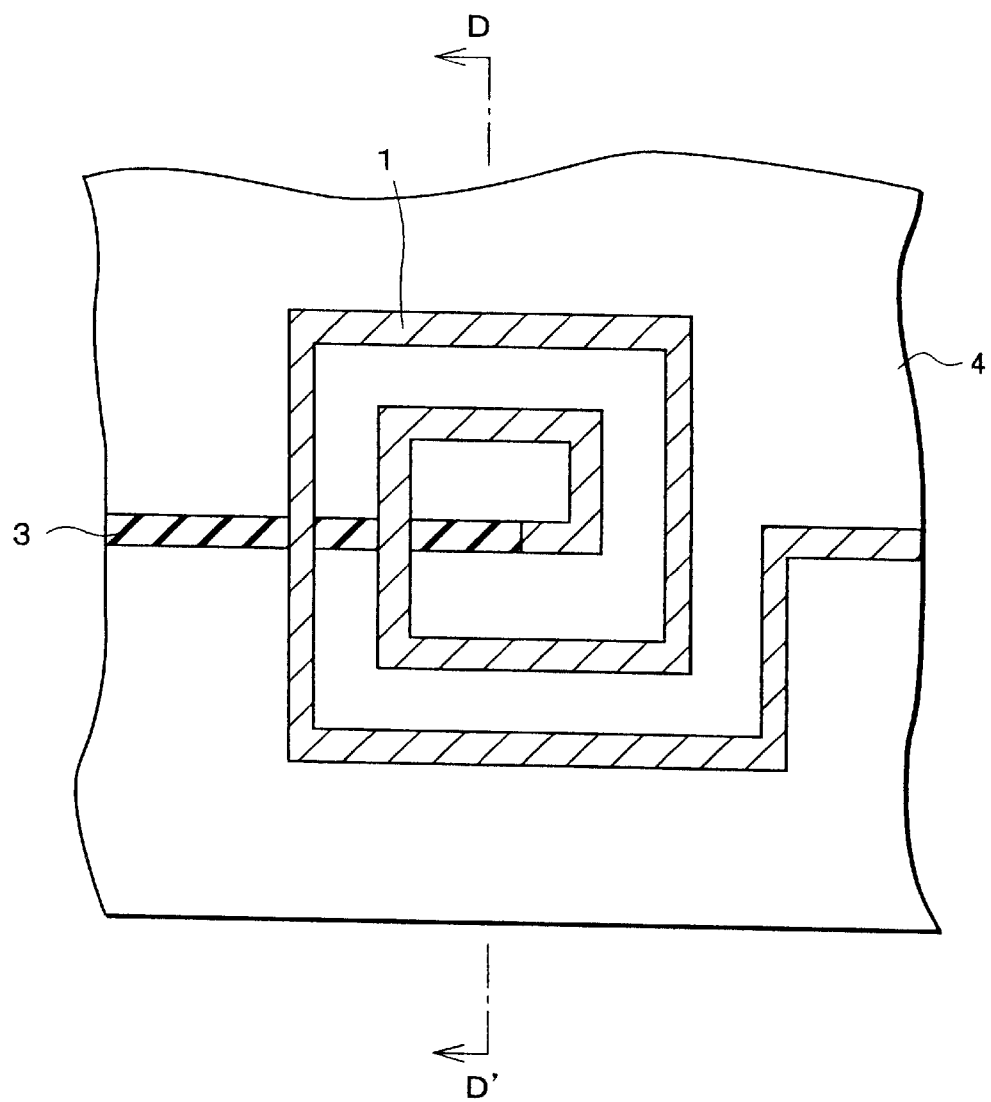
FIG. 8 is a plan view showing a schematic structure of an inductance element of a conventional semiconductor device.
Figure 9:
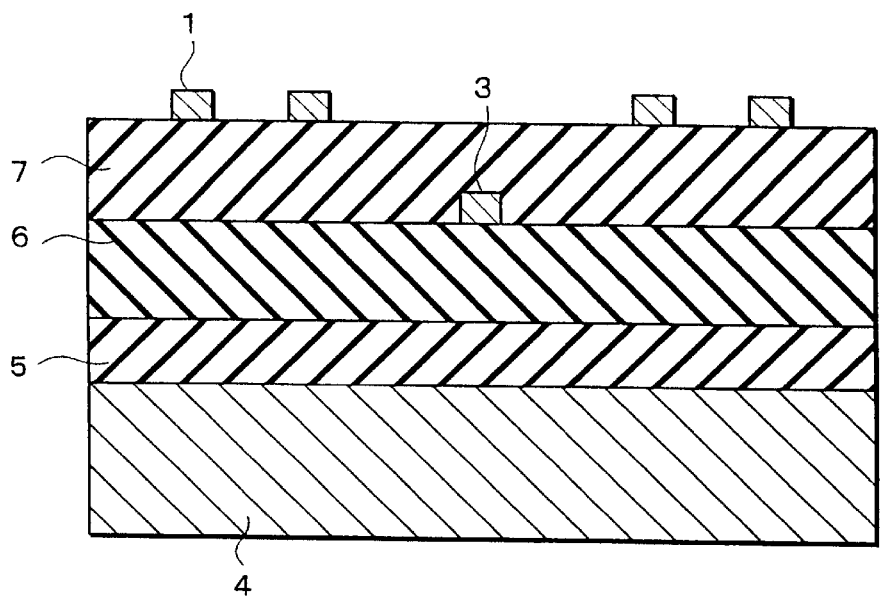
FIG. 9 is a cross sectional view in a line D–D' of the inductance element formation section of the semiconductor device shown in FIG. 8.

On the other hand, in the semiconductor device according to the present embodiment, as shown in FIG. 6 and FIG. 7, the conductive film 8 is provided on an outside of the area where the conductive film pattern 1 is formed in the spiral manner (on an outside of an outline of the conductive film pattern 1), that is, the conductive film 8 is provided on an outside of an outermost line of the conductive film pattern 1 (wire) making up the spiral inductance section, in the vicinity of an area under the conductive film (conductive film pattern), so as not to be lapped by the conductive film pattern 1 and the connection wire 3. Further, in the semiconductor device, the impurity region 9 is provided only at (a) an area under the conductive film pattern 1 making up the inductance element, (b) an area under the connection wire 3 which serves as a drawing wire for connection of the inductance element, and (c) an area where the contact hole 10 for connecting the conductive film 8 to the impurity region 9.

According to the present embodiment, the conductive film 8 can be provided so as not to be lapped by the conductive film pattern 1 and the connection wire 3 at all. Therefore, it is possible to reduce the parasitic capacitance which occurs between the conductive film pattern 1/the connection wire 3 and the grounding area (grounding potential layer) further.

Note that, in the semiconductor device shown in FIG. 6 and FIG. 7, two conductive films 8, as shown in FIG. 6 and FIG. 7, are provided. Concretely, the two conductive films 8 are provided on the outside of an outermost line of the first conductive film pattern, and the outermost line is parallel to a direction in which respective terminals of the first conductive film pattern are drawn. However, the present embodiment is not limited to this, but a single conductive film 8 may be provided in any point around the conductive film pattern 1 making up the inductance section. As long as the conductive film 8 is provided so that the impurity region 9 can be used as the grounding area (grounding potential layer), a particular limitation is not given to how the conductive film 8 is provided.

The inductance element according to the present embodiment may also be provided directly in the semiconductor device by using the semiconductor substrate 4 making up the semiconductor device and other wires etc., while forming other components, for example, the transistor 20 etc. of the circuit section such as the integrated circuit at the same time, as shown in FIG. 4 and FIG. 5 concerning Embodiment 1. Further, the inductance element may be provided as a separate part from other circuit substrates.

As described above, the inductance element according to the present invention includes an inductance section, provided above a semiconductor substrate via insulating films, which is composed of a first conductive film pattern setted to have a predetermined inductance value, wherein an impurity region, which has a grounding potential and a denser impurity than that of the semiconductor substrate, is provided on the semiconductor substrate so as to be positioned at least at an area under the first conductive film pattern.

The impurity region is electrically connected to a grounded second conductive film pattern which is provided above the impurity region via the insulating substrates. It is preferable that the second conductive film pattern is provided so as not to be positioned at an area under the first conductive film pattern.

According to the structure, the impurity region is electrically connected to the grounded second conductive film pattern which is provided above the impurity region via the insulating substrates, so that it is possible to make the impurity region grounded.

Further, the second conductive film pattern is provided so as not to be positioned at an area under the first conductive film pattern, so that the impurity region provided on the surface of the semiconductor substrate can be used as a grounding potential layer which reduces reflection and loss of a high frequency signal passing through the first conductive film pattern. As a result, it is possible to enlarge a film thickness (distance) between the inductance section and a layer or an area which is used as the grounding potential layer, so that it is possible to reduce the parasitic capacitance, compared with a conventional inductance element. Thus, it is possible to reduce attenuation of a signal level which is brought about by the parasitic capacitance.

Further, the first conductive film pattern is electrically connected to a drawing wire, connecting to an external portion, which consists of a third conductive film pattern provided on an insulating film covering the second conductive film pattern, and it is preferable that the second conductive film pattern is provided so as not to be positioned at an area under the third conductive film pattern.

According to the structure, the second conductive film pattern is provided so as not to be positioned at the area under the third conductive film pattern, so that it is possible to reduce the parasitic capacitance which occurs between the connection wire 3 and the grounding area (grounding potential layer). Thus, it is possible to improve the performance of the inductance element further.

The inductance element according to the present invention, for example, includes: the second conductive film pattern provided above the impurity region via the first insulating film; the third conductive film pattern, provided above the second conductive film pattern via a second insulating film, which serves as a drawing wire for connection of the inductance section which is composed of the first conductive film pattern; and the inductance section, provided above the third conductive film pattern via a third insulating film, which is composed of the first conducive film pattern.

The third conductive film pattern electrically connects the first conductive film pattern, for example, to an external circuit. Note that, the third conductive film pattern may be connected to a bonding wire, and may be connected to the external circuit via the boding wire.

Note that, in the present embodiment, the first conductive film pattern is provided in a spiral manner. However, the first conductive film pattern may be provided in a meandering manner.

The first conductive film pattern is, for example, connected to the drawing wire for connection which is composed of the third conductive film pattern, via a via-hole provided in an insulating film covering the drawing wire for connection. Further, the second conductive film pattern is, for example, connected to the impurity region via a via-hole provided in an insulating film covering the impurity region.

The second conductive film pattern is, for example, provided in the vicinity of the first conductive film pattern, with it along the first conductive film pattern, at least, so as not to be lapped by the first conductive film pattern.

The following arrangement may be made. The drawing wire for connection (connection wire), which is composed of the third conductive film pattern, is drawn to the outside of the conductive film pattern, and the second conductive film pattern may be extended to the outside of the first conductive film pattern, so as not to be positioned at an area under the third conductive film pattern. Concretely, in the case where, for example, the conductive film pattern is made of spiral conductive film pattern, the second conductive film pattern may be provided outside (outside an outermost line of) the first conductive film pattern, so as not to be positioned at an area under the third conductive film pattern, for example, the second conductive film pattern may be extended in a direction different from a direction in which the third conductive film pattern is drawn.

Further, the impurity region can be provided only at (a) an area below (under) the first conductive film pattern, (b) an area below (under) the third conductive film pattern which serves as the drawing wire for connection of the inductance element, and (c) an area where a contact hole (via-hole) for connecting the second conductive film pattern to the impurity region. In this case, for example, the impurity region is provided below (under) the first conductive film pattern and the third conductive film pattern, so as to be formed along the first conductive film pattern and the third conductive film pattern.

The inductance element is used, for example, with it provided in a semiconductor device.

The semiconductor device according to the present invention is arranged so that the inductance element is internally provided.

According to the structure, the semiconductor device is arranged so that the inductance element is internally provided, so that it is possible to reduce reflection and loss of a high frequency signal passing through the inductance section, which is brought about in the semiconductor substrate due to electromagnetic induction of a current applied to the inductance section of the inductance element, and it is possible to restrict decline of a Q value which indicates the performance of the inductance element with respect to frequency. Besides, the parasitic capacitance can be reduced, and it is possible to provide a semiconductor device having a high quality inductance characteristic.

The semiconductor device having the inductance element therein can be arranged so that an integrated circuit such as an LSI is provided on the semiconductor substrate making up the inductance element. Further, the semiconductor device can be arranged so that a semiconductor substrate (inductance element) having the inductance section is provided on the semiconductor substrate on which the integrated circuit is provided. Alternatively, the semiconductor device can be arranged so that plural semiconductor substrates, which includes the semiconductor substrate having the inductance section, are provided on a semiconductor mounting portion of a lead frame, so as to store the semiconductor substrates in a single package. That is, the semiconductor device may be arranged so that the inductance element is provided directly in the semiconductor device, while forming other components at the same time, by using the semiconductor substrates and other wires etc. which make up the semiconductor device. Further, the semiconductor device may be arranged so that the inductance element is provided as a separate part from other circuit substrates. Alternatively, the semiconductor device may be arranged so that the integrated circuit is not provided on the semiconductor substrate having the inductance section, and at least one semiconductor substrate, which has the integrated circuit therein, is provided additionally, and the additional semiconductor substrate and the inductance element, that is, the semiconductor substrate having the inductance section are stored in a single package and is sealed, so that the package is used as a multichip type semiconductor device.

That is, according to the present invention, for example, the semiconductor substrate (inductance element) having the inductance section is connected to a semiconductor substrate having an element area where the integrated circuit is provided, that is, to a silicon semiconductor substrate, and the semiconductor substrates are packaged. The packaged semiconductor substrates can serve as one chip which is provided in a miniature device such as a mobile communication device. Further, passive elements such as a capacitor and a resistor are mounted on the semiconductor substrate having the inductance section is provided and the integrated circuit is not provided. A semiconductor device may be arranged by combining the semiconductor substrate having the passive elements with the semiconductor substrate having the integrated circuit.

Upon combining the semiconductor substrate having the passive elements with the semiconductor substrate having the integrated circuit, the semiconductor substrate making up the inductance element may be directly glued to the semiconductor substrate having the integrated circuit, by using an adhesive. Further, upon the foregoing combination, the semiconductor substrate having the integrated circuit may be connected to the semiconductor substrate making up the inductance element by a wire in accordance with wire bonding etc. As the wire, a TAB (Tape Automated Bonding) tape and a lead frame etc. can be used. By using these wires, it is possible to electrically connect both the semiconductor substrates.

According to the present invention, the semiconductor device is arranged so that the inductance element is separated from the semiconductor substrate having the integrated circuit, for example, from an integrated circuit formation portion (element formation portion) of the semiconductor substrate, at the grounding area, that is, at the impurity region, so that it is possible to prevent other elements from being influenced by noise.

The inductance element and the semiconductor device having the inductance element according to the present invention can be widely applied to products which require the inductance element, for example, portable communication devices such as a cellular phone.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. An inductance element comprising an inductance section, provided above a semiconductor substrate via insulating films, which is composed of a first conductive film pattern setted to have a predetermined inductance value, wherein an impurity region, which has a grounding potential and a denser impurity than that of the semiconductor substrate, is integrated with the semiconductor substrate so as to be positioned at least at an area under the first conductive film pattern and in a surface of the semiconductor substrate so that the surface of the semiconductor substrate is flat, and wherein the impurity region is electrically connected to a second conductive film pattern, provided above the impurity region via one of the insulting films, which is grounded, and the second conductive film pattern is provided so as not to be positioned at the area under the first conductive film pattern.

2. The inductance element as set forth in claim 1, wherein:

the impurity region is electrically connected to a second conductive film pattern, provided above the impurity region via one of the insulating films, which is grounded, and the second conductive film pattern is provided with it along the first conductive film pattern so as to be positioned in a vicinity of the area under the first conductive film patter.

3. The inductance element as set forth in claim 1, wherein the first conductive film pattern is provided in a meandering manner.

4. The inductance element as set forth in claim 1, wherein the impurity region is provided so as to substantially cover an entire area located under the first conductive film pattern.

5. The inductance element as set forth in claim 1, wherein:

the first conductive film pattern is electrically connected to a drawing wire for external connection which is composed of a third conductive film pattern provided on one of the insulating films which covers the second conductive film pattern, and the second conductive film pattern is provided so as not to be positioned at an area under the third conductive film.

6. The inductance element as set forth in claim 5 wherein:

the drawing wire for external connection, which is composed of the third conductive film pattern, is drawn to an outside of the first conductive film pattern, and the second conductive film pattern is provided on the outside of the first conductive film pattern so as not to be positioned at the area under the third conductive film pattern, and the second conductive film pattern is provided on the outside of the first conductive film pattern so as not to be positioned at the area under the third conductive film pattern.

7. The inductance element as set forth in claim 5, wherein the impurity region is provided only at (a) the area under the first conductive film patter, (b) the area under the third conductive film pattern, and (c) an area where a contact hole for connecting the second conductive film pattern to the impurity region is provided.

8. The inductance element as set forth in claim 1, wherein the first conductive film pattern is provided in a spiral manner.

9. The inductance element as set forth in claim 8, wherein:

the impurity region is electrically connected to a second conductive film pattern, provided above the impurity region via one of the insulating films, which is grounded, and the second conductive film pattern is provided on an outside of an outermost line of the first conductive film pattern, the outermost line being parallel to a direction in which respective terminals of the first conductive film pattern are drawn.

10. The inductance element as set forth in claim 8 wherein:

the impurity region is electrically connected to a second conductive film pattern, provided above the impurity region via one of the insulating films, which is grounded, and a third conductive film patter, provided above the second conductive film pattern via a second insulating film, which serves as a drawing wire for connection of an inductance section which is composed of the first conductive film pattern, and the second conductive film pattern is provided on an outside of an outermost line of the first conductive film pattern is provided on an outside of an outermost line of the first conductive film pattern so as to be provided in a direction different from a direction in which the third conductive film pattern is drawn.

11. An inductance element comprising an inductance section, provided above a semiconductor substrate via insulating films, which is composed of a first conductive film pattern setted to have a predetermined inductance value, wherein an impurity region, which has a grounding potential and a denser impurity than that of the semiconductor substrate, is integrated with the semiconductor substrate so as to be positioned at least at an area under the first conductive film pattern and in a surface of the semiconductor substrate so that the surface of the semiconductor substrate is flat, and wherein the inductance element further comprises:

a second conductive film pattern provided above the impurity region via a first insulating film;

a third conductive film pattern, provided above the second conductive film pattern via a second insulating film, which serves as a drawing wire for connection of an inductance section which is composed of the first conductive film pattern; and the inductance section, provided above the third conductive film pattern via a third insulating film, which is composed of the first conductive film pattern.

12. The inductance element as set forth in claim 11, wherein the first conductive film pattern, the second conductive film pattern, the third conductive film pattern, and the impurity region are electrically connected to each other via via-holes.

13. A semiconductor device comprising an inductance element, wherein the inductance element comprises an inductance section, provided above a semiconductor substrate via insulating films, which is composed of a first conductive film pattern setted to have a predetermined inductance value, wherein an impurity region, which has a grounding potential and a denser impurity than that of the semiconductor substrate, is integrated with the semiconductor substrate so as to be positioned at least at an area under the first conductive film pattern and in a surface of the semiconductor substrate so that the surface of the semiconductor substrate is flat, and wherein the impurity region is electrically connected to a second conductive film pattern, provided above the impurity region is electrically connected to a second conductive film pattern, provided above the impurity region via one of the insulating films, which is grounded, and the second conductive film pattern is provided so as not to be positioned at the area under the first conductive film pattern.

14. The inductive element as set forth in claim 13, wherein the impurity region is provided so as to substantially cover an entire area located under the first conductive film pattern.

15. The semiconductor device as set forth in claim 13, wherein the inductance element is internally provided.

16. The semiconductor device as set forth in claim 15, wherein the semiconductor substrate, having the inductance section, includes a circuit section of an integrated circuit thereon.

* * * * *